(12) United States Patent
Ting et al.

(10) Patent No.: US 11,222,582 B2
(45) Date of Patent: Jan. 11, 2022

(54) ELECTRONIC DEVICE, TILED ELECTRONIC APPARATUS AND OPERATING METHOD OF THE SAME

(71) Applicant: InnoLux Corporation, Miao-Li County (TW)

(72) Inventors: Chin-Lung Ting, Miao-Li County (TW); Li-Wei Mao, Miao-Li County (TW); Shun-Yuan Hu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/575,558

(22) Filed: Sep. 19, 2019

(65) Prior Publication Data

US 2020/0126475 A1 Apr. 23, 2020

Related U.S. Application Data

(60) Provisional application No. 62/769,026, filed on Nov. 19, 2018, provisional application No. 62/747,175, filed on Oct. 18, 2018.

(30) Foreign Application Priority Data

May 23, 2019 (CN) .......................... 201910433205.1

(51) Int. Cl.
*G09G 3/32* (2016.01)
*G06F 3/042* (2006.01)
(Continued)

(52) U.S. Cl.
CPC ............. *G09G 3/32* (2013.01); *G06F 3/0421* (2013.01); *H01L 27/1214* (2013.01); *H01L 31/12* (2013.01); *G09G 2360/144* (2013.01)

(58) Field of Classification Search
CPC .................. G09G 3/32; G09G 3/3208; G09G 3/3233–3258; G09G 3/36; G09G 3/3607;
(Continued)

(56) References Cited

U.S. PATENT DOCUMENTS

| | | | |
|---|---|---|---|
| 7,940,252 B2 | 5/2011 | Chuang et al. | |
| 2006/0011913 A1 | 1/2006 | Yamazaki | |

(Continued)

FOREIGN PATENT DOCUMENTS

| | | |
|---|---|---|
| CN | 101414068 A | 4/2009 |
| CN | 108369135 A | 8/2018 |

OTHER PUBLICATIONS

European Search Report dated Feb. 20, 2020, issued in application No. EP 19202269.7.

*Primary Examiner* — Nathan Danielsen
(74) *Attorney, Agent, or Firm* — McClure, Qualey & Rodack, LLP

(57) ABSTRACT

An electronic device is provided. The electronic device includes a substrate and the electronic device also includes a light-emitting element, a sensing element and a black matrix disposed on the substrate. The sensing element is disposed adjacent to the light-emitting element. The black matrix has a plurality of openings and a light-shielding portion. The electronic device further includes a driving element disposed adjacent to and electrically connected to the light-emitting element. The sensing element includes a first thin-film transistor, and the driving element includes a second thin-film transistor. In a normal direction of the substrate, one of the openings is disposed corresponding to the sensing element, and the light-shielding portion is disposed corresponding to the driving element.

14 Claims, 13 Drawing Sheets

(51) Int. Cl.
*H01L 27/12* (2006.01)
*H01L 31/12* (2006.01)

(58) Field of Classification Search
CPC ...... G09G 3/3648–3666; G09G 2300/02–026;
G09G 2300/0408; G09G
2300/0417–0426; G09G 2300/0456–0465;
G09G 2300/0809; G09G
2310/0264–0297; G09G 2350/00; G09G
2352/00; G09G 2356/00; G09G
2360/14–148; G06F 3/0412; G06F
3/0421; G06F 3/0423; G06F 3/0428;
G06F 3/1423; G06F 3/1446; G06F
2203/04107; G06F 2203/04109; G06F
2203/04114; H01L 23/481; H01L
25/0655; H01L 25/50; H01L 27/15–156;
H01L 33/06; H01L 33/32; H01L 33/382;
H01L 33/504–508; H01L 27/1214–1233;
H01L 31/12; H01L 31/125; H01L 31/167;
H01L 31/173
See application file for complete search history.

(56) References Cited

U.S. PATENT DOCUMENTS

| | | | |
|---|---|---|---|
| 2006/0190836 A1* | 8/2006 | Ling Su | G06F 1/1624 |
| | | | 715/773 |
| 2006/0244693 A1* | 11/2006 | Yamaguchi | G06F 3/042 |
| | | | 345/76 |
| 2007/0170449 A1 | 7/2007 | Anandan | |
| 2009/0147191 A1* | 6/2009 | Nakajima | G06F 3/0421 |
| | | | 349/116 |
| 2011/0043464 A1* | 2/2011 | Lee | G06F 3/042 |
| | | | 345/173 |
| 2011/0115749 A1* | 5/2011 | Yi | G06F 3/042 |
| | | | 345/175 |
| 2013/0037826 A1 | 2/2013 | Chou | |
| 2013/0214279 A1* | 8/2013 | Nishimura | G02F 1/13624 |
| | | | 257/59 |
| 2015/0015543 A1 | 1/2015 | Hsieh | |
| 2016/0061653 A1 | 3/2016 | Chang et al. | |
| 2016/0343771 A1 | 11/2016 | Bower et al. | |
| 2017/0161543 A1 | 6/2017 | Smith et al. | |
| 2018/0190615 A1* | 7/2018 | Pan | G06F 3/044 |
| 2018/0211085 A1* | 7/2018 | Liu | G06K 9/0004 |

* cited by examiner

ELECTRONIC DEVICE, TILED ELECTRONIC APPARATUS AND OPERATING METHOD OF THE SAME

CROSS REFERENCE TO RELATED APPLICATIONS

This application claims the benefit of U.S. Provisional Application No. 62/747,175, filed Oct. 18, 2018, U.S. Provisional Application No. 62/769,026, filed Nov. 19, 2018, and also claims the benefit of Chinese Patent Application No. 201910433205.1, filed May 23, 2019, the entirety of which are incorporated by reference herein.

BACKGROUND

Technical Field

Embodiments of the present disclosure relate to an electronic device, and in particular they relate to an electronic device with a sensing function, a tiled electronic apparatus having the same, and an operating method of the same.

Description of the Related Art

Light-emitting diodes (LEDs) have been widely used in various electronic devices. However, the application of electronic devices still cannot meet demands.

SUMMARY

In accordance with some embodiments of the present disclosure, an electronic device is provided. The electronic device includes a substrate and the electronic device also includes a light-emitting element, a sensing element and a black matrix disposed on the substrate. The sensing element is disposed adjacent to the light-emitting element. The black matrix has a plurality of openings and a light-shielding portion. The electronic device further includes a driving element disposed adjacent to and electrically connected to the light-emitting element. The sensing element includes a first thin-film transistor (TFT), and the driving element includes a second thin-film transistor. In a normal direction of the substrate, one of the openings is disposed corresponding to the sensing element, and the light-shielding portion is disposed corresponding to the driving element.

In accordance with some embodiments of the present disclosure, a tiled electronic apparatus is provided. The tiled electronic apparatus includes a plurality of electronic devices. One of the electronic devices has a display region and includes a substrate, a plurality of light-emitting elements and a plurality of sensing elements. The plurality of light-emitting elements is disposed on the substrate and disposed in the display region. The plurality of sensing elements is disposed in the display region and disposed adjacent to the plurality of light-emitting elements.

In accordance with some embodiments of the present disclosure, an operating method of an electronic device is provided. The electronic device includes a first sensing element and a second sensing element. The operating method of the electronic device includes emitting a first signal using an emitter. The operating method of the electronic device also includes receiving the first signal by the first sensing element and executing a first action by the electronic device. The operating method of the electronic device further includes emitting a second signal using the emitter. The operating method of the electronic device includes receiving the second signal by the second sensing element and executing a second action by the electronic device. The first signal is different from the second signal, and the first action is different from the second action.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
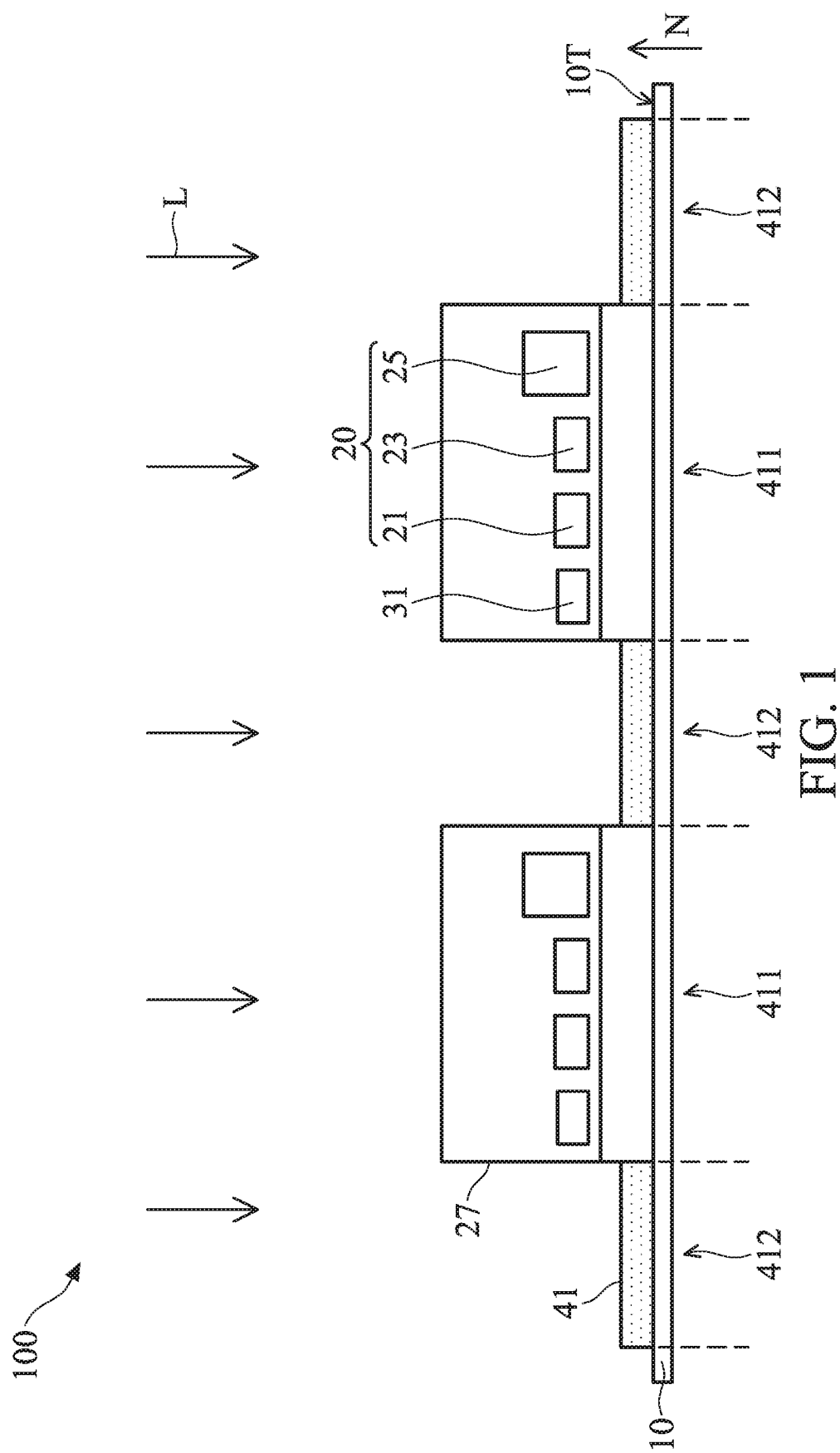
FIG. 1 is a partial cross-sectional view illustrating an electronic device according to one embodiment of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

It should be noted that the "electronic device" described in the embodiments may be a display device, a sensing device, an antenna device, a tiled device, a flexible device, any other applicable device, or a combination thereof, but the present disclosure is not limited thereto.

FIG. 1 is a partial cross-sectional view illustrating an electronic device 100 according to one embodiment of the present disclosure. It should be noted that not all components of the electronic device 100 are shown in FIG. 1, for the sake of brevity.

Referring to FIG. 1, the electronic device 100 includes a substrate 10, a light-emitting element 20, a sensing element 31 and a black matrix 41. In this embodiment, the light-emitting element 20, the sensing element 30 and the black matrix 40 are all disposed on the substrate 10. The sensing element 31 is disposed adjacent to the light-emitting element 20, and the black matrix 41 may cover the top surface 10T of the substrate 10. In some embodiments, the black matrix 41 does not overlap the light-emitting element 20 in the normal direction N of the substrate 10. In some embodiments, the black matrix 41 does not overlap the sensing element 31 in the normal direction N of the substrate 10. However, the present disclosure is not limited thereto.

In some embodiments, the substrate 10 may be a rigid substrate or a flexible substrate, and the substrate 10 may be a single-layer structure or a multi-layer structure. For example, the substrate 10 may include a printed circuit board (PCB), and the material of the substrate 10 may include glass, quartz, sapphire or any other applicable rigid material, or polyimide (PI), polyethylene terephthalate (PET or PETE), poly(methyl methacrylate) (PMMA) or any other applicable flexible material or a combination thereof. In some embodiments, the material of the substrate 10 may include liquid-crystal polymer (LCP), polycarbonate (PC), polypropylene (PP), other plastic or polymeric materials or a combination thereof, but the present disclosure is not limited thereto.

In some embodiments, the substrate 10 may include an elementary semiconductor (e.g., silicon or germanium), a compound semiconductor (e.g., silicon carbide (SiC), gallium arsenic (GaAs), indium arsenide (InAs), or indium phosphide (InP)), an alloy semiconductor (e.g., silicon germanium (SiGe), silicon germanium carbide (SiGeC), gallium arsenic phosphide (GaAsP), or gallium indium phosphide (GaInP)), any other applicable semiconductor, or a combination thereof. In some embodiments, the substrate 10 may be a semiconductor-on-insulator (SOI) substrate. The SOI substrate may include a bottom substrate, an insulating layer disposed on the bottom substrate, and a semiconductor layer disposed on the insulating layer. In some embodiments, the substrate 10 may include a semiconductor wafer (e.g., a silicon wafer, or any other applicable semiconductor wafer). However, the present disclosure is not limited thereto.

In some embodiments, the substrate 10 may include various p-type doped regions and/or n-type doped regions formed by a process such as an ion implantation process and/or a diffusion process. For example, the doped regions may be configured to form a transistor, a photodiode, and/or a light-emitting diode, but the present disclosure is not limited thereto.

In some embodiments, the substrate 10 may include various isolation features to separate various device regions in the substrate 10. For example, the isolation features may include a shallow trench isolation (STI) feature, but the present disclosure is not limited thereto. In some embodiments, the formation of the STI feature may include etching a trench in the substrate 10 and filling in the trench with insulating materials (e.g., silicon oxide, silicon nitride, or silicon oxynitride). The filled trench may have a multi-layer structure, such as an oxide layer and silicon nitride filled in the trench. A chemical mechanical polishing (CMP) process may be performed to polish back excessive insulating materials and planarize the top surface of the isolation features.

In some embodiments, the substrate 10 may include various conductive features (e.g., conductive lines or vias). For example, the conductive features may be made of aluminum (Al), copper (Cu), tungsten (W), an alloy thereof, any other applicable conductive material, or a combination thereof.

The light-emitting element 20 is disposed on the substrate 10. In some embodiments, the light-emitting element 20 may include lamps, bulbs, light-emitting diodes (LEDs), quantum dots (QDs), fluorescent material, phosphor material, any other applicable luminescent material, or a combination thereof, but the present disclosure is not limited thereto. In some embodiments, examples of light-emitting diodes may include an organic light-emitting diode (OLED), a quantum dots light-emitting diode (QLED or QDLED), a micro light-emitting diode, a mini light-emitting diode, or a combination thereof, but the present disclosure is not limited thereto.

In some embodiments, the light-emitting element 20 may include, for example, electrodes, semiconductor layers, multiple quantum wells or wavelength conversion layers, and so on, but the present disclosure is not limited thereto. For example, the light-emitting element 20 may include a first light-emitting chip 21 (e.g., blue light-emitting chip), a second light-emitting chip 23 (e.g., green light-emitting chip), a third light-emitting chip 25 (e.g., red light-emitting chip), and the first light-emitting chip 21, the second light-emitting chip 23 and the third light-emitting chip 25 may be formed in a package structure 27. For example, the light-emitting element 20 (at least one of the first light-emitting chip 21, the second light-emitting chip 23 and the third light-emitting chip 25) is encapsulated by a package material to form the package structure 27, but the present disclosure is not limited thereto. It should be noted that the number and the type of the light-emitting chips included in the light-emitting element 20 are not limited to those shown in FIG. 1. For example, in some embodiments, the light-emitting element 20 may also include a fourth light-emitting chip 21 (e.g., white light-emitting chip, green light-emitting chip, yellow light-emitting chip, and so on).

The sensing element 31 is disposed on the substrate 10. In this embodiment, the sensing element 31 is disposed adjacent to the first light-emitting chip 21, the second light-emitting chip 23 and/or the third light-emitting chip 25, and is also formed in the package structure 27. For example, the light-emitting element 20 (at least one of the first light-emitting chip 21, the second light-emitting chip 23 and the third light-emitting chip 25) and the sensing element 31 are encapsulated by a package material to form the package structure 27, but the present disclosure is not limited thereto. The sensing element 31 may be a light-sensing element, such as a photodiode and/or any other applicable element, which may convert the received light signal into a current signal.

As shown in FIG. 1, the sensing element 31 is used to sense ambient light L entering (the package structure 27 of) the electronic device 100. When a user touches or approaches the surface of (the package structure 27 of) the electronic device 100 with a finger or another part of the body, the light intensity is weakened due to the influence of the user's finger (or another part of the body) on the ambient light L, so the sensing element 31 may sense a change of light intensity entering the electronic device 100, thereby determining that the user is touching or approaching the position of (the package structure 27 of) the electronic device 100 with the finger or another part of the body, or further executing a specific action in response. Therefore, the electronic device 100 may be used to display information or further serve an interactive function similar to that in the touch display device, which will be described in detail later.

In some embodiments, the user does not have to touch or approach the electronic device 100 with a finger or another part of the body, and an emitter (not shown) may be used to emit light, which has a wavelength that can be received by the sensing element 31, to the electronic device 100, so the sensing element 31 may sense the light emitted by the emitter and entering the electronic device 100, thereby determining the position of the light emitted by the emitter pointing to the electronic device 100, or further executing a specific action in response to serve an interactive function. For example, the emitter may be an infrared (IR) pen or a LASER (light amplification by stimulated emission of radiation) pen, and the sensing element 31 may sense infrared ray or LASER ray, but the present disclosure is not limited thereto.

In some embodiments, the electronic device 100 may further include a display unit, a logic board (e.g., timing controller (T-con)) (not shown), a system board (not shown) and a display control board (not shown). In some embodiments, the substrate 10, the light-emitting element 20, the sensing element 31 and the black matrix 41 may be disposed in the display unit. In some embodiments, the logic board may be electrically connected to the display unit and the system board. When the sensing element receives a signal, the signal may be transmitted to the logic board; the logic board may process the signal sensed by the sensing component 31 (e.g., identifying the location) and transmit the processing result to the system board. In some embodiments, the display control board may be electrically connected to the system board and the display unit. For example, when the system board receives the processing result from the logic board, the system board determines an instruction corresponding to the processing result according to the processing result of the logic board (for example, executing a specific action), and transmits the instruction to the display control board; then, the display control board controls the display unit to execute the corresponding action according to the received instruction. However, the present disclosure is not limited thereto. Other applicable operating methods may be used in the electronic device in the embodiments of the present disclosure.

In some embodiments, the black matrix 41 is disposed on the substrate 10. In this embodiment, the black matrix 41 may cover a portion of the top surface 10T of the substrate 10. For example, as shown in FIG. 1, the black matrix 41 may have a plurality of openings 411 and a light-shielding portion 412. The openings 411 may be disposed corresponding to the package structure 27, and the light-shielding portion 412 does not overlap the package structure 27 in the normal direction N of the substrate 10, but the present disclosure is not limited thereto. In some embodiments, the light-shielding portion 412 may be in contact with the package structure 27, but the present disclosure is not limited thereto. In some embodiments, a gap may be between the light-shielding portion 412 and the package structure 27, but the present disclosure is not limited thereto. Since the substrate 10 may include other routing, the routing may reflect the ambient light L and affect the sensing element 31 sensing the light entering the electronic device 100. Therefore, the accuracy of the sensing element 31 may be improved by providing the light-shielding portion 412.

In some embodiments, the material of the black matrix 41 may include photoresist (e.g., black photoresist, or other applicable photoresist which is not transparent), ink (e.g., black ink, or other applicable ink which is not transparent), molding compound (e.g., black molding compound, or other applicable molding compound which is not transparent), solder mask (e.g., black solder mask, or other applicable solder mask which is not transparent), epoxy polymer, any other applicable material, or a combination thereof, but the present disclosure is not limited thereto. In some embodiments, the material of the black matrix 41 may include a light curing material, a thermal curing material, or a combination thereof, but the present disclosure is not limited thereto. In some embodiments, the black matrix 41 may be formed by an etching process, a coating process, or a deposition process.

Figure 2:
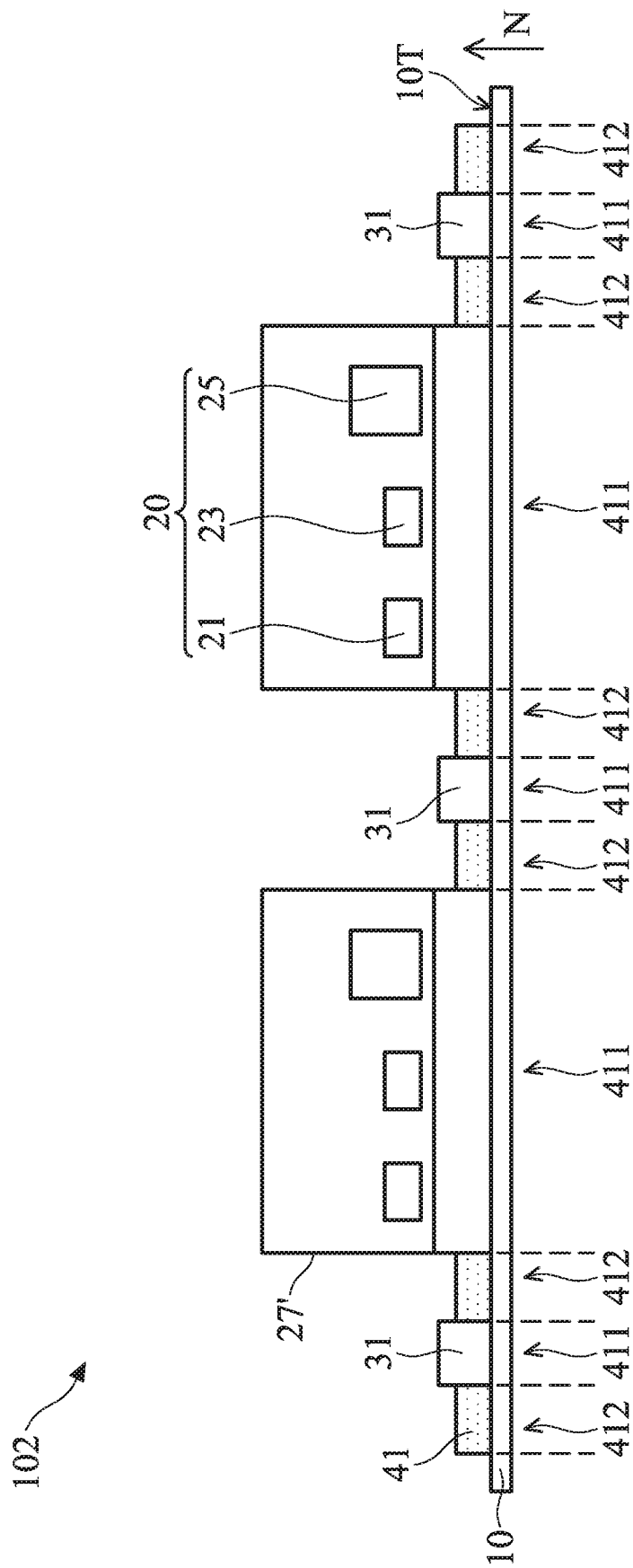
FIG. 2 is a partial cross-sectional view illustrating an electronic device according to another embodiment of the present disclosure.

FIG. 2 is a partial cross-sectional view illustrating an electronic device 102 according to another embodiment of the present disclosure. Similarly, not all components of the electronic device 102 are shown in FIG. 2, for the sake of brevity.

Referring to FIG. 2, the electronic device 102 includes a substrate 10, a light-emitting element 20, a sensing element 31 and a black matrix 41. In this embodiment, the light-emitting element 20, the sensing element 31 and the black matrix 41 are all disposed on the substrate 10. The sensing element 31 is disposed adjacent to the light-emitting element 20, and the black matrix 41 may cover the top surface 10T of the substrate 10. In some embodiments, the black matrix 41 does not overlap the light-emitting element 20 in the normal direction N of the substrate 10. In some embodiments, the black matrix 41 does not overlap the sensing element 31 in the normal direction N of the substrate 10.

In this embodiments, the light-emitting element 20 may include a first light-emitting chip 21, a second light-emitting chip 23, a third light-emitting chip 25, and the first light-emitting chip 21, the second light-emitting chip 23 and the third light-emitting chip 25 may be formed in a package structure 27'. The difference from the electronic device 100 shown in FIG. 1 is that the sensing element 31 of the electronic device 102 is formed between the package structures 27', not formed in the package structures 27'. Moreover, as shown in FIG. 2, the black matrix 41 may have a plurality of openings 411 and a light-shielding portion 412. The openings 411 may be disposed corresponding to the package structure 27' and the sensing element 31, and the light-shielding portion 412 does not overlap the package structure 27' and the sensing element 31 in the normal direction N of the substrate 10, but the present disclosure is not limited thereto. In some embodiments, the light-shielding portion 412 may be in contact with the package structure 27' and/or the sensing element 31, but the present disclosure is not limited thereto. In some embodiments, a gap may be between the light-shielding portion 412 and the package structure 27' and/or the sensing element 31, but the present disclosure is not limited thereto.

Similarly, the sensing element 31 may be used to sense ambient light L entering the electronic device 102. When a user touches or approaches the surface of the electronic device 102 with a finger or another part of the body, the light intensity is weakened due to the influence of the user's finger (or another part of the body) on the ambient light L, so the sensing element 31 may sense a change of light intensity entering the electronic device 102, thereby determining that the user is touching or approaching the position of the electronic device 102 with the finger or another part of the body, or further executing a specific action in response. Moreover, when an emitter (e.g., IR pen, LASER pen, and so on) emits light, which has a wavelength that can be received by the sensing element 31, to the electronic device 102, the sensing element 31 may sense the light emitted by the emitter and entering the electronic device 102, thereby determining the position of the light emitted by the emitter pointing to the electronic device 102, or further executing a specific action in response to serve an interactive function. Thus, the electronic device 102 may be used to display information or to serve an interactive function.

Figure 3:
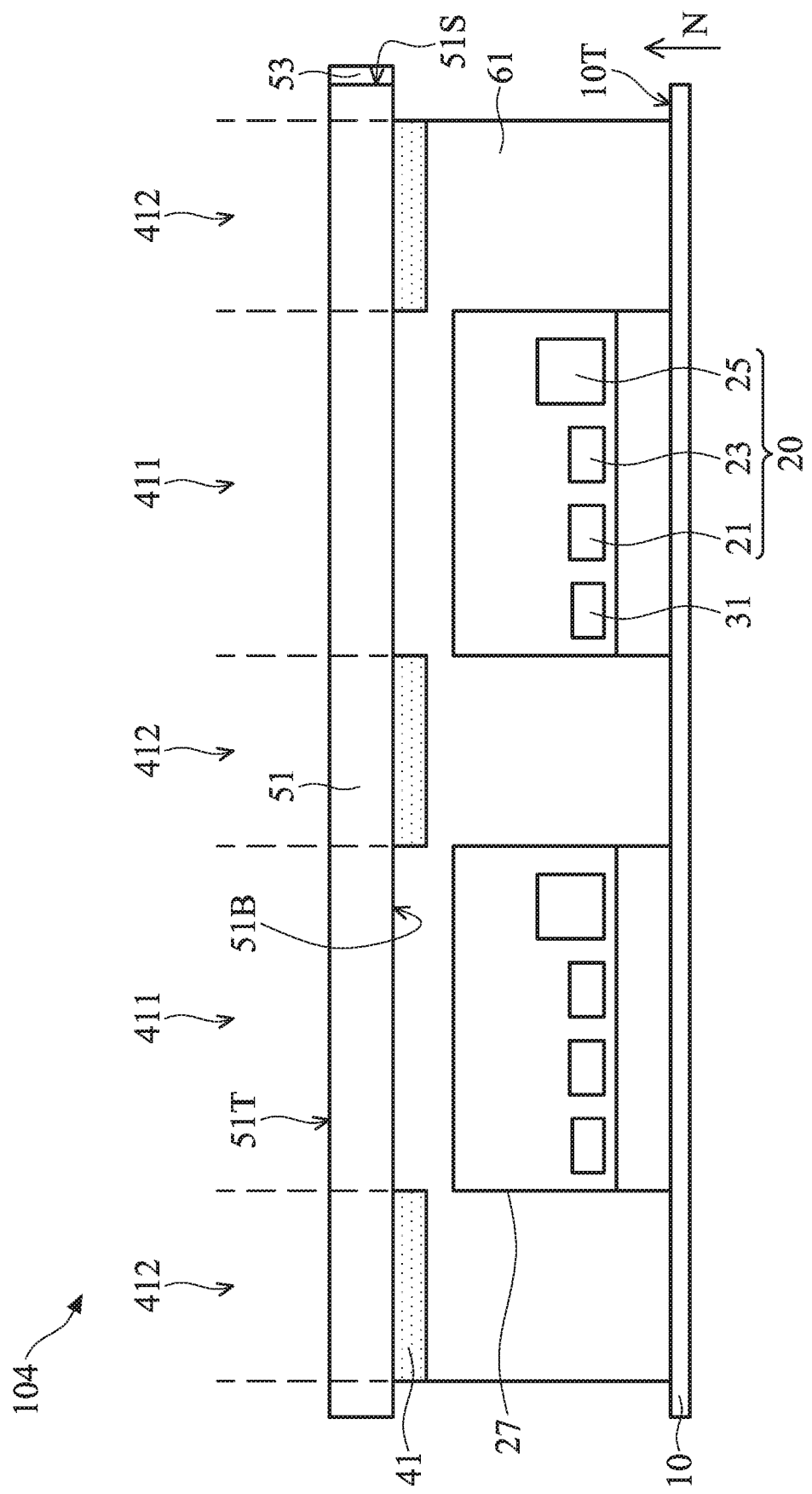
FIG. 3 is a partial cross-sectional view illustrating an electronic device according to one embodiment of the present disclosure.

FIG. 3 is a partial cross-sectional view illustrating an electronic device 104 according to one embodiment of the present disclosure. Similarly, not all components of the electronic device 104 are shown in FIG. 3, for the sake of brevity.

Referring to FIG. 3, the electronic device 104 includes a substrate 10, a light-emitting element 20, a sensing element 31 and a black matrix 41. In this embodiment, the electronic device 104 further includes a cover layer 51 and an adhesion layer 61.

As shown in FIG. 3, the light-emitting element 20 is disposed on the substrate 10, and the light-emitting element 20 may include a first light-emitting chip 21, a second light-emitting chip 23 and a third light-emitting chip 25; the sensing element 31 is disposed adjacent to the first light-emitting chip 21, the second light-emitting chip 23 and/or the third light-emitting chip 25, and the first light-emitting chip 21, the second light-emitting chip 23, the third light-emitting chip 25 and the sensing element 31 may be formed in a package structure 27.

The cover layer 51 may be disposed on the light-emitting element 20. That is, the cover layer 51 may be disposed corresponding to the substrate 10. In some embodiments, the cover layer 51 may be a rigid substrate or a flexible substrate, and the cover layer 51 may be a single-layer structure or a multi-layer structure. For example, the material of the cover layer 51 may include glass, quartz, sapphire or any other applicable rigid material, or polyimide (PI), polyethylene terephthalate (PET or PETE), poly(methyl methacrylate) (PMMA) or any other applicable flexible material or a combination thereof, but the present disclosure is not limited thereto. In some embodiments, the material of the cover layer 51 may include liquid-crystal polymer (LCP), polycarbonate (PC), polypropylene (PP), other plastic or polymeric materials or a combination thereof, but the present disclosure is not limited thereto.

In some embodiments, the cover layer 51 may have, for example, a function of water-proof or dust-proof, and so on, which may reduce the risk of the electronic device 104 being damaged or reducing the accuracy of the sensing element 31 by the user's touch for a long time, and further may protect the electronic device 104 or extend the life of the electronic device 104.

In some embodiments, the cover layer 51 may be a resistive or capacitive touch screen. For example, when the cover layer 51 is a capacitive touch screen, the cover layer 51 may include a base layer, an upper transparent electrode layer disposed on the top surface of the base layer and/or a lower transparent electrode layer disposed on the bottom surface of the base layer, or a scratch-resistant layer may be disposed on the upper transparent electrode layer, but the present disclosure is not limited thereto. In some embodiments, the electronic device 104 may include any suitable touch structure to serve the touch function, and the touch structure may be disposed on any surface of the electronic device 104, but the present disclosure is not limited thereto.

The adhesion layer 61 may be disposed between the substrate 10 and the cover layer 51, and cover the package structure 27 (i.e., cover the light-emitting element 20 and the sensing element 31). In some embodiments, the material of the adhesion layer 61 may include silicone polymer, transparent photoresist, polyimide, epoxy resin, any other applicable material, or a combination thereof, but the present disclosure is not limited thereto. In some embodiments, the material of the adhesion layer 61 may include a light curing material, a thermal curing material or a combination thereof. For example, a spin-on coating process, a slit coating process or an inkjet printing process may be performed to coat the material of the adhesion layer 61 on the substrate 10 and the package structure 27, but the present disclosure is not limited thereto.

The black matrix 41 is disposed on the cover layer 51. In particular, the black matrix 41 may be disposed on the bottom surface 51B of the cover layer 51 facing the top surface 10T of the substrate 10 as shown in FIG. 3. In some embodiments, the black matrix 41 may have a plurality of openings 411 and a light-shielding portion 412. The openings 411 may be disposed corresponding to the package structure 27, and the light-shielding portion 412 does not overlap the package structure 27 in the normal direction N of the substrate 10, but the present disclosure is not limited thereto.

In some embodiments, the electronic device 104 may further include a radiating element 53, and the radiating element 53 may be disposed on the sidewall 51S of the cover layer 51. The radiating element 53 may be used to emit light having the wavelength that can be received by the sensing element 31. For example, the radiating element 53 may be used to emit light having the wavelength in the range of invisible light, such as infrared light (wavelength at about 760 nm to 1 mm) or ultraviolet light (wavelength at about 10 nm to 400 nm), but the present disclosure is not limited thereto.

The light emitted by the radiating element 53 may form a total reflection in the cover layer 51. When a user touches the top surface 51T of the cover layer 51 with a finger or another part of the body, the (partial) light emitted by the radiating element 53 may be reflected and directed toward the sensing element 31, thereby determining that the user is touching the position of the cover layer 51 with the finger or another part of the body, or further executing a specific action in response.

In some embodiments, the suitable material of the cover layer 51 may be selected depending on the wavelength of the light emitted by the radiating element 53 and the extent to which the material absorbs for the above wavelength. For example, when the wavelength of light emitted by the radiating element 53 is shorter (higher energy), the material having less light absorption of short wavelengths (e.g., sapphire, or the like) may be selected to form the cover layer 51; when the wavelength of light emitted by the radiating element 53 is longer (lower energy), the material having less light absorption of long wavelengths (e.g., plastic material, polymer, or the like) may be selected to form the cover layer 51, but the present disclosure is not limited thereto.

Figure 4:
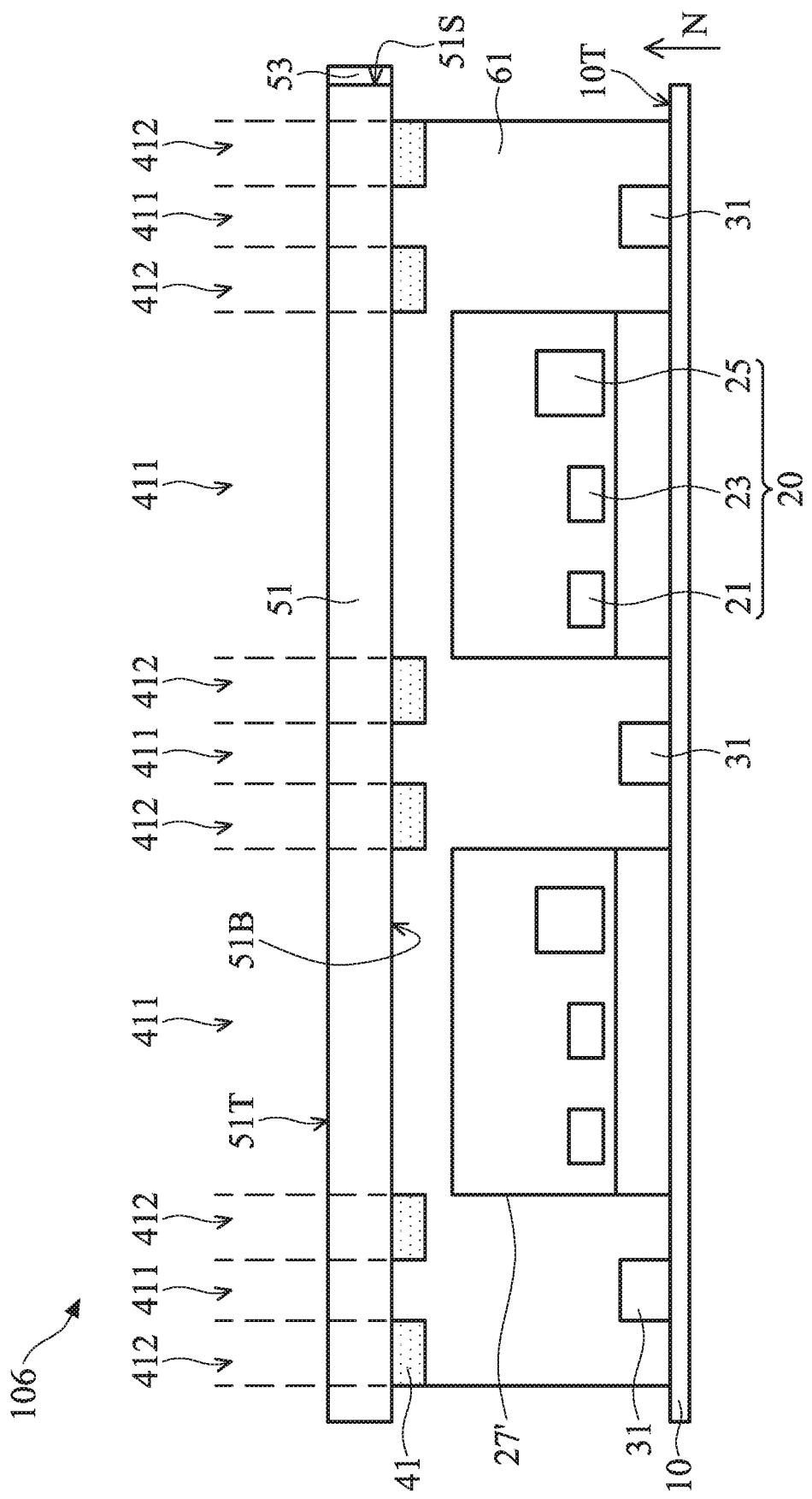
FIG. 4 is a partial cross-sectional view illustrating an electronic device according to another embodiment of the present disclosure.

FIG. 4 is a partial cross-sectional view illustrating an electronic device 106 according to another embodiment of the present disclosure. Similarly, not all components of the electronic device 106 are shown in FIG. 4, for the sake of brevity.

Referring to FIG. 4, the electronic device 106 includes a substrate 10, a light-emitting element 20, a sensing element 31 and a black matrix 41. In this embodiment, the electronic device 106 further includes a cover layer 51 and an adhesion layer 61. The light-emitting element 20 is disposed on the substrate 10, the cover layer 51 is disposed on the light-emitting element 20 (i.e., the cover layer 51 may be disposed corresponding to the substrate 10), and the adhesion layer 61 is disposed between the substrate 10 and the cover layer 51 and covers the light-emitting element 20 and the sensing element 31.

As shown in FIG. 4, the light-emitting element 20 may include a first light-emitting chip 21, a second light-emitting chip 23 and a third light-emitting chip 25, and the first light-emitting chip 21, the second light-emitting chip 23 and the third light-emitting chip 25 may be formed in a package structure 27'. The difference from the electronic device 104 shown in FIG. 3 is that the sensing element 31 of the electronic device 106 is formed between the package structures 27', not formed in the package structure 27'.

The black matrix 41 is disposed on the cover layer 51. In particular, the black matrix 41 may be disposed on the bottom surface 51B of the cover layer 51 facing the top surface 10T of the substrate 10 as shown in FIG. 4. In some embodiments, the black matrix 41 may have a plurality of openings 411 and a light-shielding portion 412. The openings 411 may be disposed corresponding to the package structure 27' and the sensing element 31, and the light-shielding portion 412 does not overlap the package structure 27' and the sensing element 31 in the normal direction N of the substrate 10, but the present disclosure is not limited thereto.

Similarly, the electronic device 106 may further include a radiating element 53, and the radiating element 53 may be disposed on the sidewall 51S of the cover layer 51. The radiating element 53 may be used to emit light having the wavelength that can be received by the sensing element 31. For example, the radiating element 53 may be used to emit light having the wavelength in the range of invisible light, such as infrared light (wavelength at about 760 nm to 1 mm) or ultraviolet light (wavelength at about 10 nm to 400 nm), but the present disclosure is not limited thereto.

In the foregoing embodiments, the sensing component 31 includes a photo sensing function that may be used to sense the change of light received by the electronic devices 100, 102, 104, 106, thereby determining relevant position information or further executing a specific action in response. In some embodiments, the sensing element 31 may be used to sense the intensity of the ambient light, thereby causing the light-emitting element 20 to adjust the intensity of light emitted by the light-emitting element 20 according to the intensity of the sensed ambient light (e.g., executing light compensation). Alternatively, the sensing element 31 may also be used to sense the intensity change of the light emitted by the light-emitting element 20 (or the degree of light attenuation of the light-emitting element 20), thereby adjusting the current intensity passing through the light-emitting element 20. For example, adjusting the current intensity passing through the first light-emitting chip 21, the second light-emitting chip 23 or the third light-emitting chip 25 to maintain good display quality, but the present disclosure is not limited thereto.

In some embodiments, the sensing element 31 may also include a thermal sensing function that may be used to sense temperature changes of the light-emitting element 20 or the entire electronic device 100, 102, 104 or 106, and to make corresponding processing. For example, when the temperature of the light-emitting element 20 or the entire electronic device 100, 102, 104 or 106 is too high, the sensing element 31 may sense this phenomenon and cause the electronic device 100, 102, 104 or 106 to execute corresponding processing. For example, the cooling system inside the electronic device is activated or the current passing through the light-emitting element 20 is adjusted, but the present disclosure is not limited thereto.

In addition, in the foregoing embodiments, the electronic devices 100, 102, 104, and 106 all include the sensing component 31, but the present disclosure is not limited thereto. In some embodiments, the light-emitting element 20 itself may function as a sensing element without the need to provide additional sensing elements.

Figure 5:
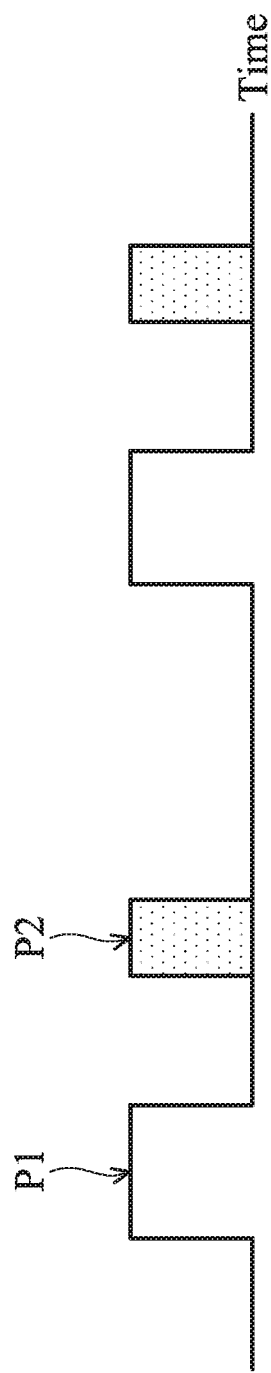
FIG. 5 is a schematic diagram illustrating the duty cycle of the light-emitting element according to one embodiment of the present disclosure.

FIG. 5 is a schematic diagram illustrating the duty cycle of the light-emitting element 20 according to one embodiment of the present disclosure. As shown in FIG. 5, in the period P1, the light emitting element 20 emits light normally; in the period P2, the light-emitting element 20 may function as a sensing element (e.g., the light-emitting element 20 may stop emitting light) for sensing the position of the user touching or approaching the electronic device 100, 102, 104 or 106 with a finger or another part of the body, or sensing the position of the light having the wavelength that may be received by the sensing element 31 and emitted by the emitter toward the electronic device 100, 102, 104 or 106.

In some embodiments, the period P1 and the period P2 may be alternately presented as shown in FIG. 5, and the frequency of the period P1 (i.e., the number of times of illumination of the light-emitting element 20 per unit time) may be 60 Hz, but the present disclosure is not limited thereto. In other embodiments, the frequency of the period P1 may be 120 Hz or 240 Hz. When the frequency of the period P1 is high enough, the viewer may be prevented from interfering with the information displayed on the electronic device 100, 102, 104 or 106, and the viewing quality may be maintained.

Similarly, the frequency of the period P2 (i.e., the number of times the light-emitting element 20 is used as the sensing element per unit time) may be 60 Hz, but the present disclosure is not limited thereto. In other embodiments, the frequency of the period P2 may be 120 Hz or 240 Hz. When the frequency of the period P2 is high enough, the accuracy of the sensing may be further improved.

Moreover, although the number of occurrences of the period P1 and the number of occurrences of the period P2 are the same in FIG. 5, that is, the ratio of occurrence of the period P1 to occurrence of the period P2 is 1:1, the present disclosure is not limited thereto. In some embodiments, the number of occurrences of the period P1 and the number of occurrences of the period P2 may be different. For example, the ratio of the occurrence of the period P1 to the occurrence of the period P2 may be 1:2 or 1:3, depending on actual needs. In detail, the light-emitting element 20 may function as a sensing element during the period P2. In some embodiments, during the period in which the light-emitting element 20 does not emit light (e.g., between two adjacent periods P1), a plurality of periods P2 may be included, and the frequency of the period P2 may be larger than the frequency of the period P1, but the present disclosure is not limited thereto.

Furthermore, although the foregoing embodiment has been described with the light-emitting element 20 as the sensing element for at least part of the period of time during which no light is emitted, the present disclosure is not limited thereto. In some embodiments, during the period P2, the light-emitting element 20 may emit another light signal as a sensing signal, such as a light (e.g., invisible light) having the wavelength that can be received by the light-emitting element 20 or other additionally provided sensing elements (e.g., sensing element 31), for sensing the position of the user touching or approaching the electronic device 100, 102, 104 or 106 with a finger or another part of the body.

For example, during the period P2, the light-emitting element 20 emits a sensing signal. When a user touches or approaches the electronic device 100, 102, 104 or 106 with a finger or another part of the body, the sensing signal may be reflected back to the light-emitting element 20 or other additionally provided sensing elements (e.g., sensing element 31), thereby detecting the position of the user's finger, or another part of the body, that is touching or approaching the electronic device 100, 102, 104 or 106.

Figure 6:
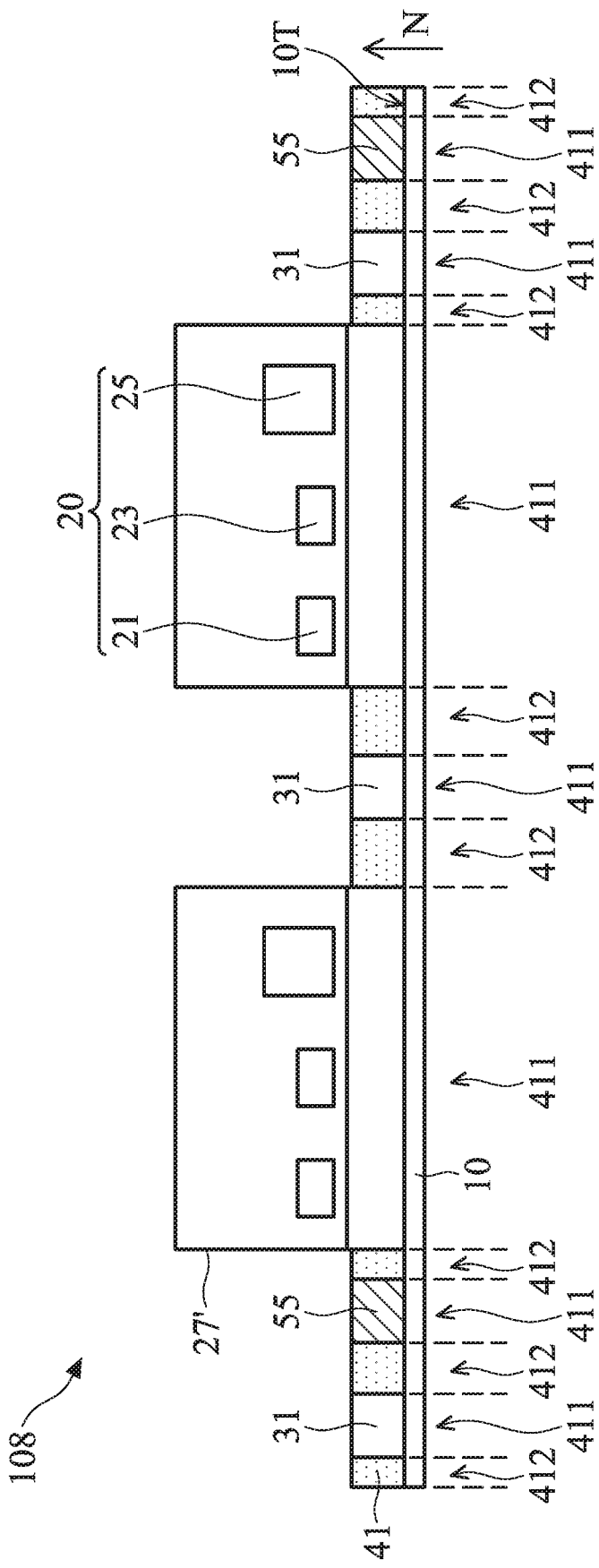
FIG. 6 is a partial cross-sectional view illustrating an electronic device according to one embodiment of the present disclosure.

FIG. 6 is a partial cross-sectional view illustrating an electronic device 108 according to one embodiment of the present disclosure. Similarly, not all components of the electronic device 108 are shown in FIG. 6, for the sake of brevity.

Referring to FIG. 6, the electronic device 108 includes a substrate 10, a light-emitting element 20, a sensing element 31 and a black matrix 41. In this embodiment, the light-emitting element 20, the sensing element 31 and the black matrix 41 are all disposed on the substrate 10, and the sensing element 31 is disposed adjacent to the light-emitting element 20.

As shown in FIG. 6, the light-emitting element 20 may include a first light-emitting chip 21, a second light-emitting chip 23 and a third light-emitting chip 25, and the first light-emitting chip 21, the second light-emitting chip 23 and the third light-emitting chip 25 may be formed in a package structure 27', and the sensing element 31 of the electronic device 108 may be formed between the package structures 27', not formed in the package structure 27'. The difference from the electronic device 102 shown in FIG. 2 is that the electronic device 108 may further include a radiating element 55 that may be disposed outside the package structure 27' and disposed adjacent to the sensing element 31. For example, the radiating element 55 may be formed between the package structures 27'.

The radiating element 55 may be used to emit light having the wavelength that can be received by the sensing element 31. For example, the radiating element 55 may be used to emit light having the wavelength in the range of invisible light, such as infrared light (wavelength at about 760 nm to 1 mm) or ultraviolet light (wavelength at about 10 nm to 400 nm), but the present disclosure is not limited thereto.

When a user touches or approaches the electronic device 108 with a finger or another part of the body, the (partial) light emitted by the radiating element 55 may be reflected and directed toward the sensing element 31, thereby allowing the sensing element 31 to sense the position of the user's finger or another part of the body that is touching or approaching the electronic device 108.

In some embodiments, the sensing element 31 may detect different signals at different times. For example, during the emission of the light from the radiating element 55, the sensing element 31 may detect the light emitted by the radiating element 55 being reflected by the user's finger or another part of the body, thereby detecting the position of the user's finger or another part of the body that is touching or approaching the electronic device 108; during other periods, the sensing element 31 may detect ambient light or light emitted by the light-emitting element 20 to, for example, adjust the current passing through the light-emitting element 20, but the present disclosure is not limited thereto.

In this embodiment, the black matrix 41 may have a plurality of openings 411 and a light-shielding portion 412. The openings 411 may be, for example, disposed corresponding to the light-emitting element 20, the sensing element 31 and the radiating element 55, and the light-shielding portion 412 may cover a portion of the top surface 10T of the substrate 10. For example, the black matrix 41 does not overlap the light-emitting element 20, the sensing element 31 and the radiating element 55 in the normal direction N of the substrate 10, but the present disclosure is not limited thereto. In some embodiments, the light-shielding portion 412 may be in contact with the package structure 27', the sensing element 31 and/or the radiating element 55, but the present disclosure is not limited thereto. In some embodiments, a gap may be between the light-shielding portion 412 and the package structure 27', the sensing element 31 and/or the radiating element 55, but the present disclosure is not limited thereto.

Figure 7:
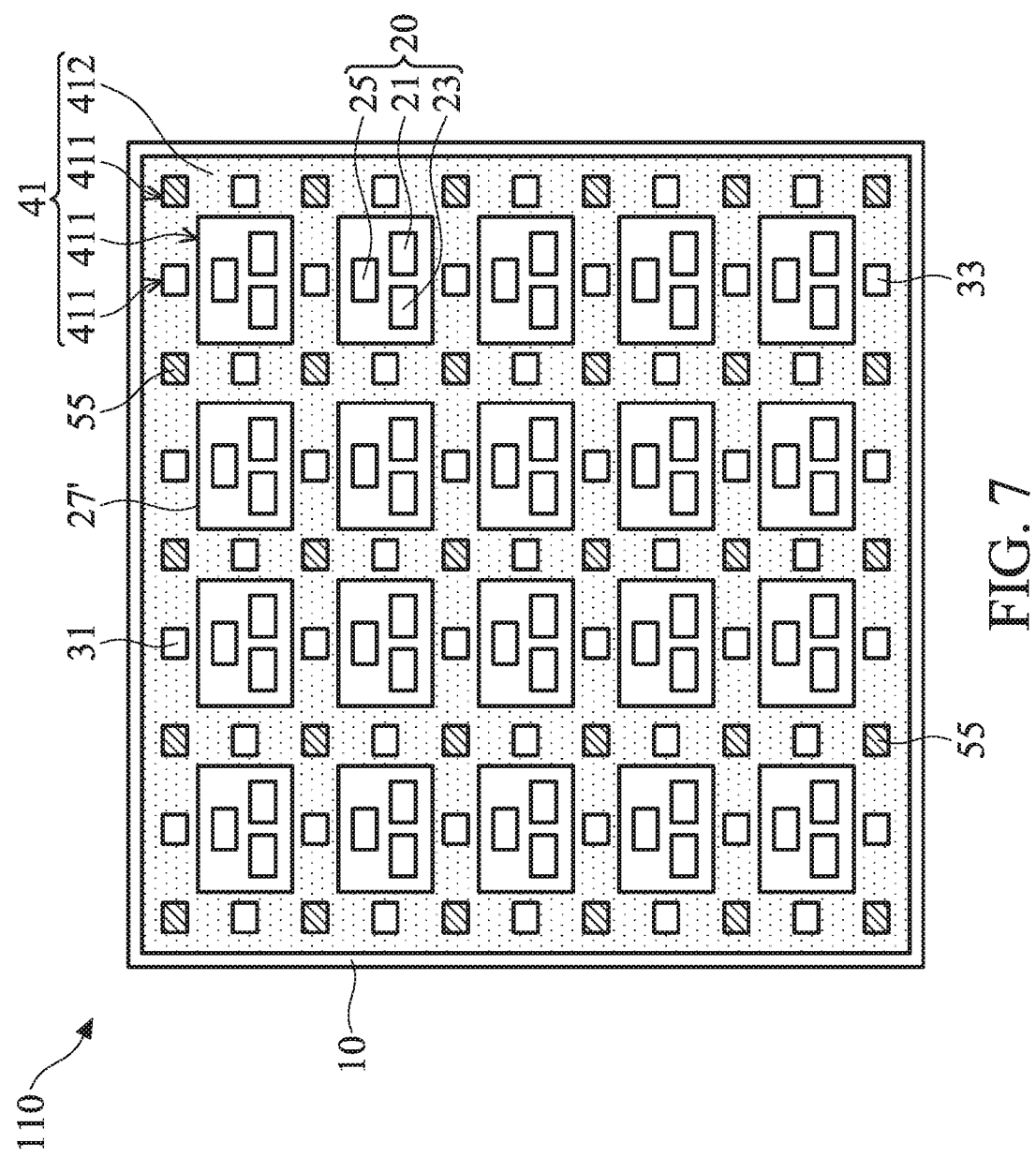
FIG. 7 is a partial top view illustrating an electronic device according to another embodiment of the present disclosure.

FIG. 7 is a partial top view illustrating an electronic device 110 according to another embodiment of the present disclosure. Similarly, not all components of the electronic device 110 are shown in FIG. 7, for the sake of brevity.

Referring to FIG. 7, the electronic device 110 includes a substrate 10, a light-emitting element 20, a sensing element 31, a black matrix 41 and a radiating element 55. In this embodiment, the light-emitting element 20, the sensing element 31, the black matrix 41 and a radiating element 55 are all disposed on the substrate 10.

In this embodiment, the light-emitting element 20 may include a first light-emitting chip 21, a second light-emitting chip 23 and a third light-emitting chip 25, and the first light-emitting chip 21, the second light-emitting chip 23 and the third light-emitting chip 25 may be formed in a package structure 27'. As shown in FIG. 7, the black matrix 41 may have a plurality of openings 411 and a light-shielding portion 412. The openings 411 may be, for example, disposed corresponding to the light-emitting element 20 (the package structure 27'), the sensing element 31 and the radiating element 55, and the light-shielding portion 412 may cover a portion of the top surface of the substrate 10. For example, the black matrix 41 does not overlap the light-emitting element 20, the sensing element 31 and the radiating element 55 in the normal direction N of the substrate 10 (i.e., the top view shown in FIG. 7).

In some embodiments, a plurality of sensing elements 31 and a plurality of radiating elements 55 may be alternately arranged around a plurality of package structures 27' (e.g., disposed between the plurality of package structures 27'), but the present disclosure is not limited thereto. The number and the arrangement of the sensing element 31 and the radiating element 55 may be adjusted depending on actual needs.

Figure 8:
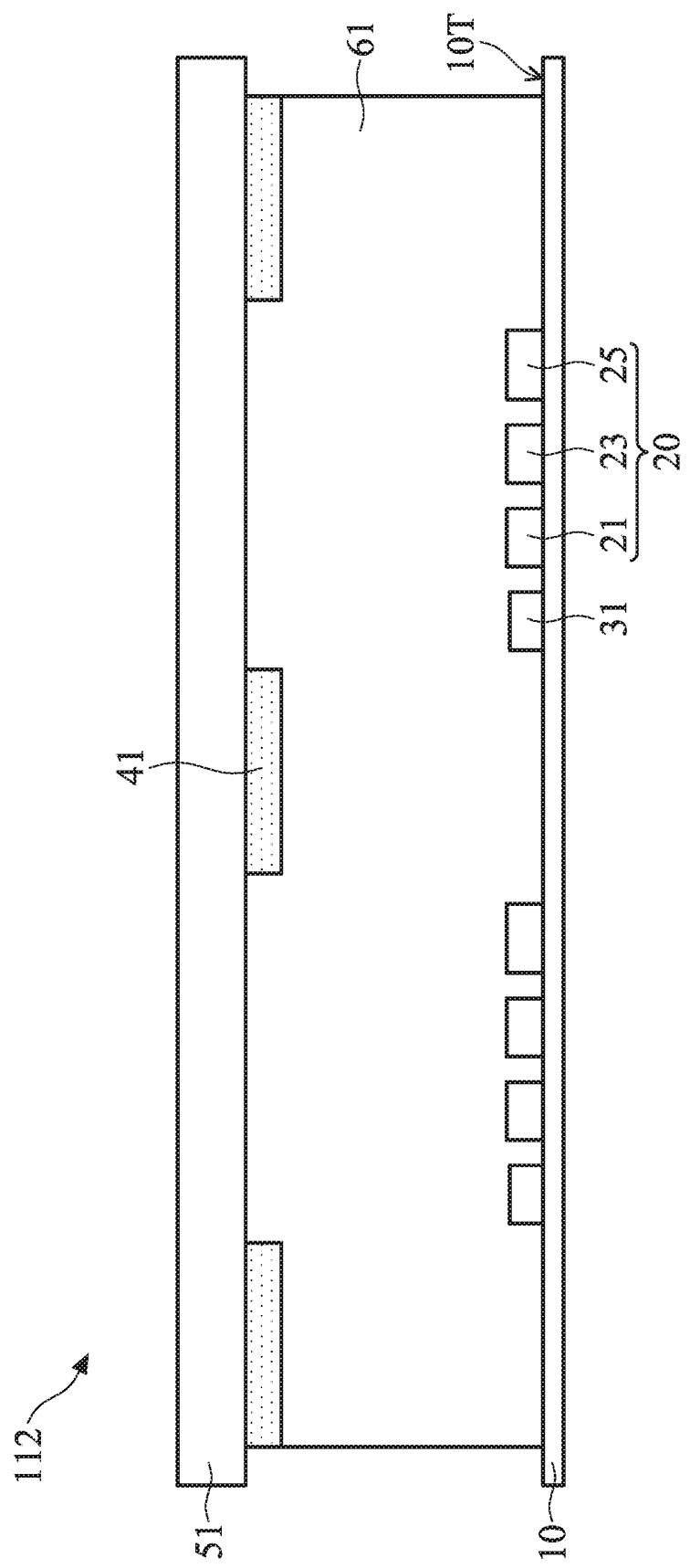
FIG. 8 is a partial cross-sectional view illustrating an electronic device according to another embodiment of the present disclosure.

FIG. 8 is a partial cross-sectional view illustrating an electronic device 112 according to another embodiment of the present disclosure. Similarly, not all components of the electronic device 112 are shown in FIG. 8, for the sake of brevity.

Referring to FIG. 8, the electronic device 112 includes a substrate 10, a light-emitting element 20, a sensing element 31, a black matrix 41, a cover layer 51 and an adhesion layer 61. The light-emitting element 20 and the sensing element 31 are disposed on the top surface 10T of the substrate 10, the cover layer 51 is disposed on the light-emitting element 20 and disposed corresponding to the substrate 10, the black matrix 41 is disposed on the cover layer 51, and the adhesion layer 61 is disposed between the substrate 10 and the cover layer 51 and covers the light-emitting element 20 and the sensing element 31.

As shown in FIG. 8, the light-emitting element 20 may include a first light-emitting chip 21, a second light-emitting chip 23 and a third light-emitting chip 25, and the sensing element 31 is disposed adjacent to the light-emitting element 20. The difference from the foregoing embodiments is that the first light-emitting chip 21, the second light-emitting chip 23 and the third light-emitting chip 25 are not formed in a package structure, but are directly disposed on the substrate 10 in the form of chip on board (COB). In the example where the electronic device 112 is a display device, the chips of the light-emitting elements 20 may be arranged in this manner to increase the resolution of the electronic device 112.

It should be noted that the form of chip on board (COB) may also be applied to the electronic device 100 shown in FIG. 1, the electronic device 102 shown in FIG. 2, the electronic device 104 shown in FIG. 3, the electronic device 106 shown in FIG. 4, the electronic device 108 shown in FIG. 6, the electronic device 110 shown in FIG. 7 or other electronic devices not shown in the embodiments of the present disclosure, which are not described herein.

Figure 9:
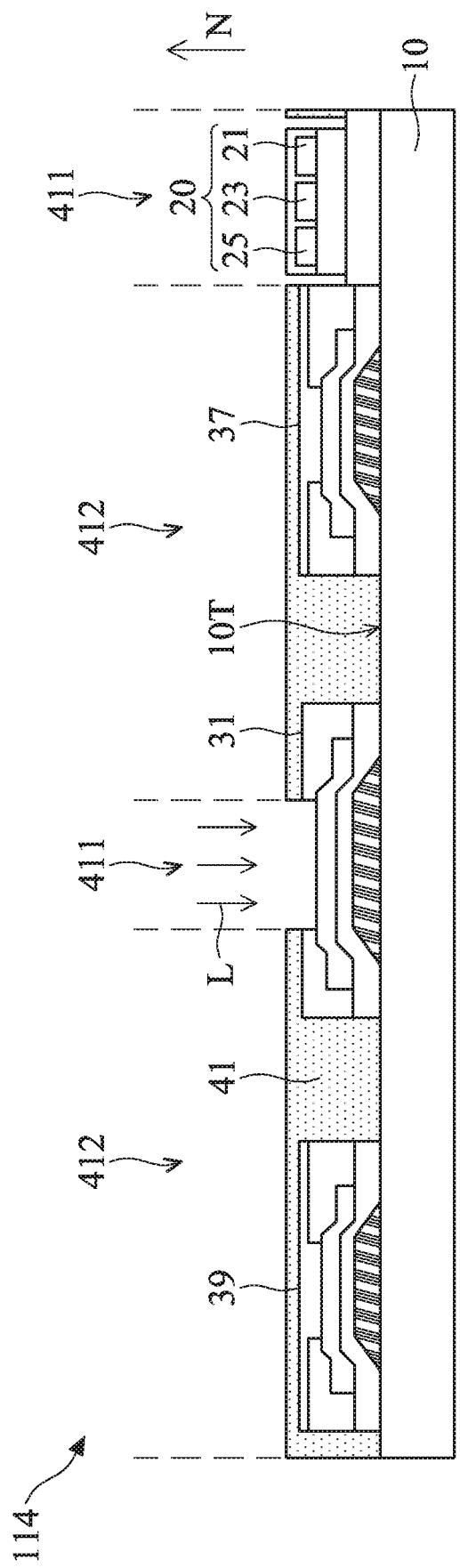
FIG. 9 is a partial cross-sectional view illustrating an electronic device according to another embodiment of the present disclosure.

FIG. 9 is a partial cross-sectional view illustrating an electronic device 114 according to another embodiment of the present disclosure. Similarly, not all components of the electronic device 114 are shown in FIG. 9, for the sake of brevity.

Referring to FIG. 9, the electronic device 114 includes a substrate 10, a light-emitting element 20, a sensing element 31 and a black matrix 41. The light-emitting element 20, the sensing element 31 and the black matrix 41 are all disposed on the substrate 10. In some embodiments, the electronic device 114 may include an active driving circuit or a passive driving circuit, but the present disclosure is not limited thereto. In some embodiments, the active driving circuit or the passive driving circuit may be, for example, used to drive the light-emitting element 20, but the present disclosure is not limited thereto. The active driving circuit may include a driving element 37, and the driving element 37 is disposed adjacent to the light-emitting element 20 and electrically connected to the light-emitting element 20 for driving the light-emitting element 20 (e.g., driving the light-emitting element 20 to emit light or other signals).

In some embodiments, the black matrix 41 may have a plurality of openings 411 and a light-shielding portion 412. In the normal direction N of the substrate 10, the openings 411 may be disposed corresponding to the sensing element 31 and the light-emitting element 20, and the light-shielding portion 412 is disposed on a portion of the top surface 10T of the substrate 10. For example, the light-shielding portion 412 may be disposed corresponding to the driving element 37. It should be noted that the light-shielding portion 412 may also shield a portion of the sensing elements 31 (e.g., the source 317 and the drain 319 of the sensing element 31 shown in FIG. 10).

Figure 10:
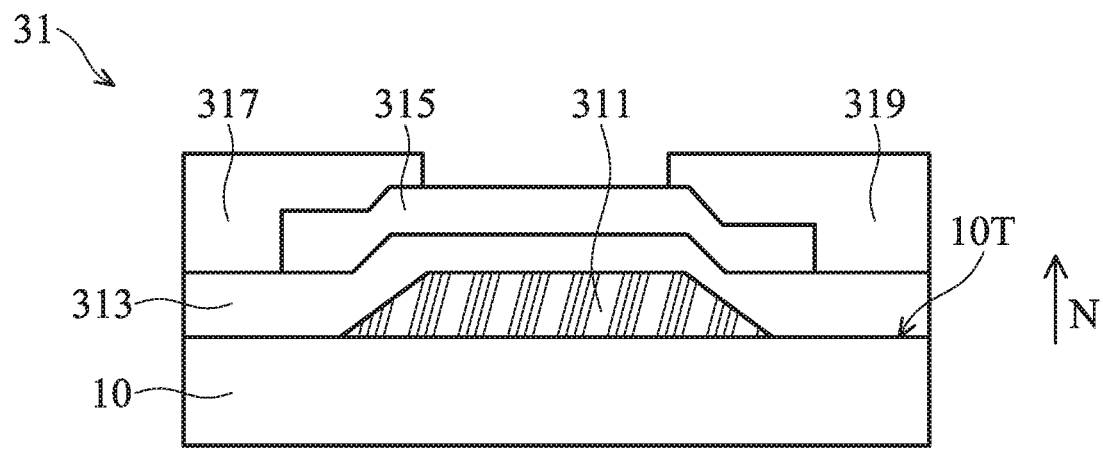
FIG. 10 is a partial cross-sectional view illustrating the sensing element according to one embodiment of the present disclosure.

As shown in FIG. 9, in this embodiment, the sensing element 31 and the driving element 37 includes thin-film transistors (TFTs). FIG. 10 is a partial cross-sectional view illustrating the sensing element 31 according to one embodiment of the present disclosure. As shown in FIG. 10, the sensing element 31 may be a bottom-gate thin-film transistor (TFT), which includes a gate 311, a gate insulating layer 313, a semiconductor layer 315, a source 317, and a drain 319. The gate 311 is disposed on the substrate 10; the gate insulating layer 313 is disposed on the gate 311, and a portion of the gate insulating layer 313 may cover the top surface 10T of the substrate 10; the semiconductor layer 315 is disposed on the gate insulating layer 313; the source 317 and the drain 319 are disposed on the semiconductor layer 315 and are respectively disposed on opposite sides of the semiconductor layer 315 (i.e., the source 317 and the drain 319 do not completely cover the semiconductor layer 315), but the present disclosure is not limited thereto.

In some embodiments, the material of the semiconductor layer 315 may include low temperature poly-silicon (LTPS), indium gallium zinc oxide (IGZO), amorphous silicon (a-Si), any other applicable material or a combination thereof, but the present disclosure is not limited thereto.

Similarly, the sensing element 31 may be used to sense ambient light L entering the electronic device 114. When a user touches or approaches the surface of the electronic device 114 with a finger or another part of the body, the light intensity is weakened due to the influence of the user's finger (or another part of the body) on the ambient light L, so the sensing element 31 may sense a change of light intensity entering the electronic device 114, thereby determining that the user is touching or approaching the position of the electronic device 114 with the finger or another part of the body, and in some embodiments, further executing a specific action in response. Moreover, when an emitter (e.g., IR pen, LASER pen, and so on) emits light, which has a wavelength that can be received by the sensing element 31, to the electronic device 114, the sensing element 31 may sense the light emitted by the emitter and entering the electronic device 114, thereby determining the position of the light emitted by the emitter pointing to the electronic device 114, and in some embodiments, further executing a specific action in response to serve an interactive function. Thus, the electronic device 114 may be used to display information or to serve an interactive function.

In some embodiments, the driving element 37 may have a structure similar to the sensing element 31, but the material of the semiconductor layer in the driving element 37 may be the same as or different from the material of the semiconductor layer in the sensing element 31. Referring to FIG. 9 and FIG. 10, in the normal direction N of the substrate 10, the opening 411 of the black matrix 41 is disposed corresponding to (the semiconductor layer 315 of) the sensing element 31 (i.e., the opening 411 of the black matrix 41 partially overlaps (the semiconductor layer 315 of) the sensing element 31); the light-shielding portion 412 of the black matrix 41 is disposed corresponding to the driving element 37 (i.e., light-shielding portion 412 of the black matrix 41 partially overlaps the driving element 37), but the present disclosure is not limited thereto. The opening 411 of the black matrix 41 allows (the semiconductor layer 315 of) the sensing element 31 to sense a signal (e.g., ambient light L or light emitted by the emitter), thereby determining relevant information or further executing a specific action in response.

As shown in FIG. 9, in some embodiments, the electronic device 114 may further include a sensing element switch 39, and the sensing element switch 39 may be disposed adjacent to the sensing element 31. For example, the sensing element switch 39 includes a thin film transistor (TFT), and the sensing element switch 39 may have a structure similar to the sensing element 31 or the driving element 37; the light-shielding portion 412 of the black matrix 41 is disposed corresponding to the sensing element switch 39, that is, the black matrix 41 overlaps the sensing element switch 39 in the normal direction N of the substrate 10, but the present disclosure is not limited thereto.

Figure 11:
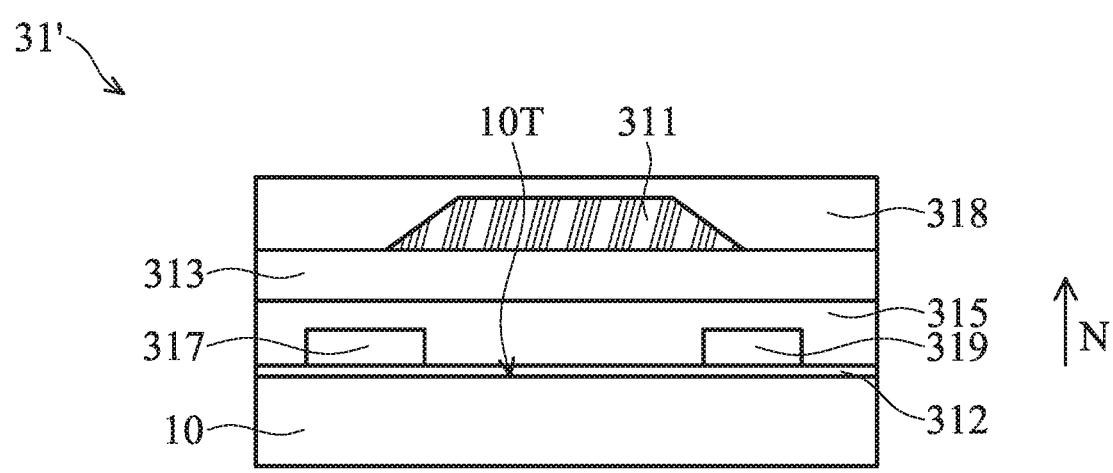
FIG. 11 is a partial cross-sectional view illustrating the sensing element according to another embodiment of the present disclosure.

FIG. 11 is a partial cross-sectional view illustrating the sensing element 31' according to another embodiment of the present disclosure. The sensing element 31' shown in FIG. 11 may be used to replace the sensing element 31 shown in FIG. 10 and disposed in the electronic device 114 of FIG. 9. Similarly, the driving element 37 and the sensing element switch 39 shown in FIG. 9 may have the structure similar to the sensing element 31' shown in FIG. 11 or may have any other applicable structure, but the present disclosure is not limited thereto. In some embodiments, the material of the semiconductor layer in the driving element 37 and the material of the semiconductor layer in the sensing element switch 39 may be the same as or different from the material of the semiconductor layer in the sensing element 31'. As shown in FIG. 11, the sensing element 31' may be a top-gate thin-film transistor (TFT), which includes a gate 311, a gate insulating layer 313, a semiconductor layer 315, a source 317, and a drain 319. In this embodiment, the sensing element 31' may further include a reflective layer 312 and an insulating layer 318. It should be noted that the thin film transistor structures shown in FIG. 10 and FIG. 11 are merely examples, and the present disclosure is not limited thereto.

As shown in FIG. 11, in this embodiment, the reflective layer 312 is disposed on (the top surface 10T of) the substrate 10; the semiconductor layer 315, the source 317 and the drain 319 are disposed on the reflective layer 312; the gate insulating layer 313 is disposed on the semiconductor layer 315; the gate 311 is disposed on the gate insulating layer 313; the insulating layer 318 partially overlaps the gate 311, and a portion of the insulating layer 318 is in contact with the gate insulating layer 313, but the present disclosure is not limited thereto. In another embodiment (not shown), the semiconductor layer 315 may be disposed on the substrate 10; the gate insulating layer 313 may be disposed on the semiconductor layer 315; the gate 311 may be disposed on the gate insulating layer 313; the insulating layer 318 may partially overlap the gate 311; the source 317 and the drain 319 are in contact with the semiconductor layer 315 and are disposed on both sides of the gate 311 and on the insulating layer 318.

Figure 12:
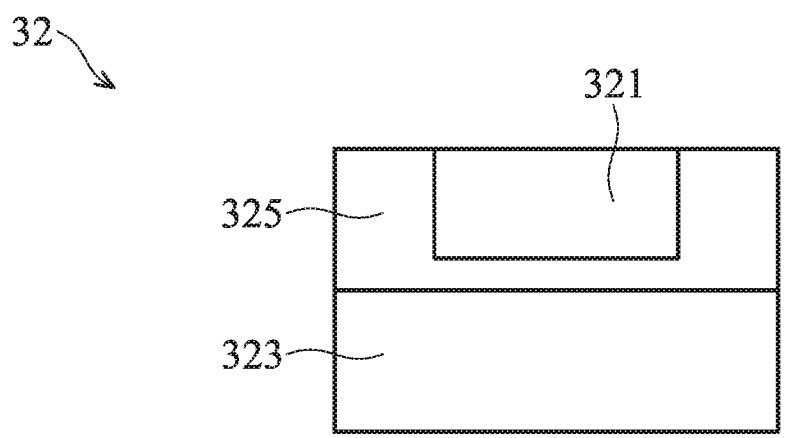
FIG. 12 is a partial cross-sectional view illustrating the sensing element according to still another embodiment of the present disclosure.

FIG. 12 is a partial cross-sectional view illustrating the sensing element 32 according to still another embodiment of the present disclosure. The sensing element 32 shown in FIG. 12 may be used to replace the sensing element 31 shown in FIG. 10 and disposed in the electronic device 114 of FIG. 9. As shown in FIG. 12, the sensing element 32 may be a PIN diode, which includes a P layer 321 composed of a P-type semiconductor material, an N layer 323 composed of an N-type semiconductor material and an I layer 325 composed of a low-doped semiconductor material, and the I layer 325 is disposed between the P layer 321 and the N layer 323, but the present disclosure is not limited thereto.

Figure 13:
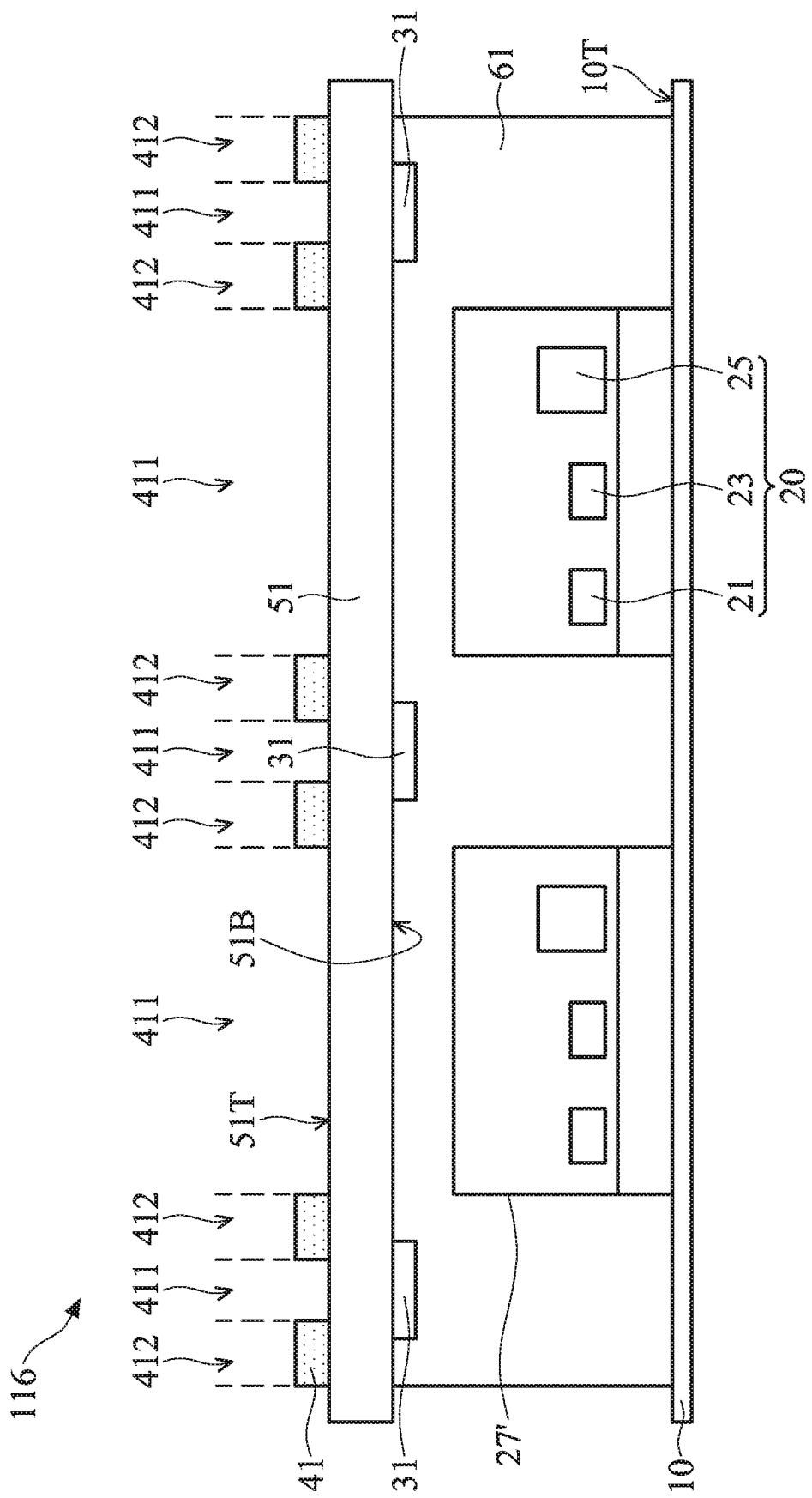
FIG. 13 is a partial cross-sectional view illustrating an electronic device according to one embodiment of the present disclosure.
Figure 14:
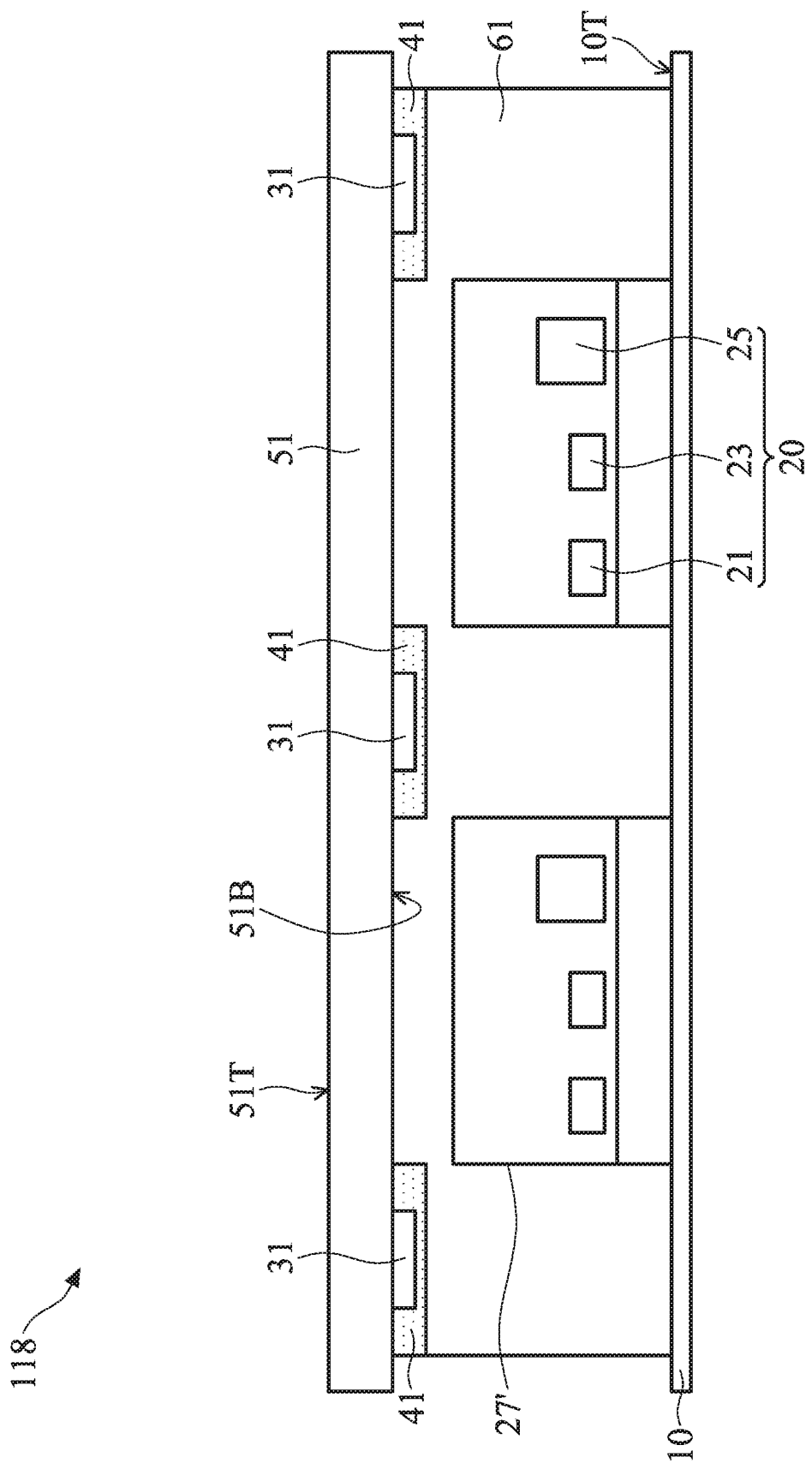
FIG. 14 is a partial cross-sectional view illustrating an electronic device according to another embodiment of the present disclosure.

It should be noted that the sensing elements (31, 31', 32) are disposed on (the top surface 10T of) the substrate 10 in the foregoing embodiment, but the present disclosure is not limited thereto. FIG. 13 is a partial cross-sectional view illustrating an electronic device 116 according to one embodiment of the present disclosure; FIG. 14 is a partial cross-sectional view illustrating an electronic device 116 according to another embodiment of the present disclosure. Similarly, not all components of the electronic device 116 and the electronic device 118 are shown in FIG. 13 and FIG. 14, for the sake of brevity.

As shown in FIG. 13, in some embodiments, the black matrix 41 of the electronic device 116 may be disposed on the top surface 51T of the cover layer 51, the sensing element 31 may be disposed on the bottom surface 51B of the cover layer 51, and at least a portion of the sensing element 31 may be disposed corresponding to the opening 411 of the black matrix 41. Alternatively, as shown in FIG. 14, in some embodiments, the black matrix 41 and the sensing element 31 of the electronic device 118 may be disposed on the bottom surface 51B of the cover layer 51, and the black matrix 41 at least partially covers the sensing element 31, but the present disclosure is not limited thereto. As long as it does not affect the way sensing element 31 is sensed, it may be applied to the embodiments of the present disclosure, and no further description is provided here.

Figure 15:
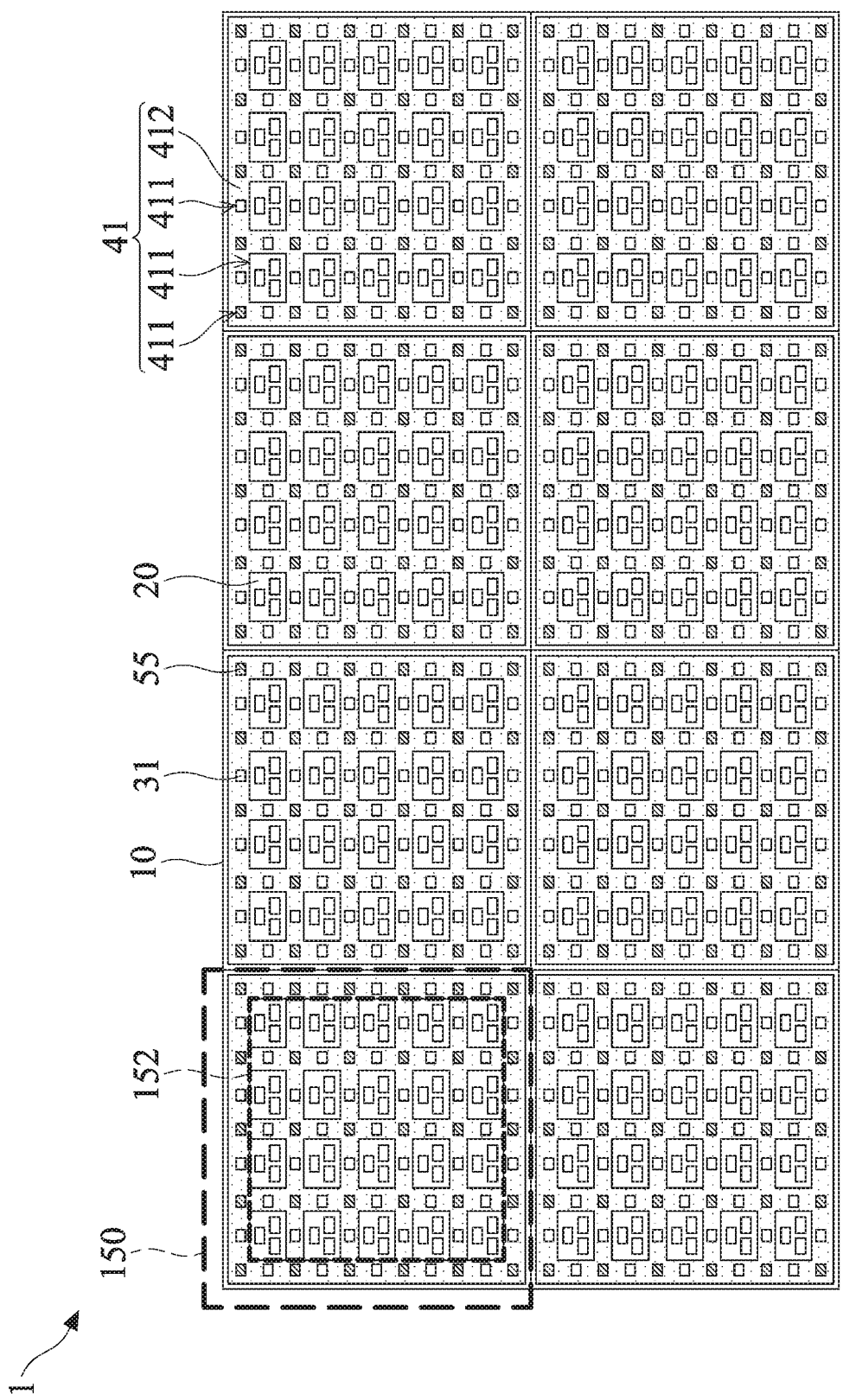
FIG. 15 is a partial cross-sectional view illustrating a tiled electronic apparatus according to one embodiment of the present disclosure.

FIG. 15 is a partial cross-sectional view illustrating a tiled electronic apparatus 1 according to one embodiment of the present disclosure. Similarly, not all components of the tiled electronic apparatus 1 are shown in FIG. 15, for the sake of brevity.

In some embodiments, the tiled electronic apparatus 1 may include a plurality of electronic devices 150. For example, the electronic device 150 may have a structure similar to the electronic device 100, 102, 104, 106, 108, 110, 112, 114, 116 or 118 in the foregoing embodiments. The following is an example in which each of the electronic devices 150 has a structure similar to the structure of the electronic device 114, whose partial cross-section may be referred to FIG. 9, but the present disclosure is not limited thereto.

In this embodiment, each electronic device 150 includes a substrate 10, a plurality of light-emitting elements 20, and a plurality of sensing elements 31. As shown in FIG. 15, the electronic device 150 has a display region 152, and the plurality of light-emitting elements 20 is disposed in the display region 152. The plurality of light-emitting elements 20 is disposed on the substrate 10, and the plurality of sensing elements 31 may be, for example, disposed adjacent to the plurality of light-emitting elements 20. For example, the sensing elements 31 may be disposed between the light-emitting elements 20.

In some embodiment, the sensing element 31 includes a thin-film transistor (TFT) structure as shown in FIG. 10 (or FIG. 11). In some embodiments, the electronic device 150 may further include a plurality of driving elements 37 (referring to FIG. 9), and the driving elements 37 may be disposed adjacent to the light emitting elements 20 and/or the sensing elements 31. In some embodiments, the drive element 37 is similar to the sense element 31 that includes a thin film transistor (TFT) structure, and the driving element 37 is electrically connected to the light-emitting element 20 for driving the light-emitting element 20 (e.g., driving the light-emitting element 20 to emit light or other signals). In some embodiments, the driving element 37 may be disposed between the light-emitting elements 20, or the driving element 37 may be partially disposed under the light-emitting element 20. That is, the driving element 37 and the light-emitting element 20 may partially overlap in the normal direction N of the substrate 10, but the present disclosure is not limited thereto.

In some embodiments, the electronic device 150 may further include a plurality of radiating element 55 each disposed outside the light-emitting element 20 and disposed adjacent to the sensing element 31. For example, the radiating elements 55 may be formed between the light-emitting elements 20 and/or alternately arranged with the sensing elements 31, but the present disclosure is not limited thereto.

In some embodiments, the electronic device 150 may further include a black matrix 41, and the black matrix 41 may have a plurality of openings 411 and a light-shielding portion 412. As shown in FIG. 15, in the normal direction N of the substrate 10 (i.e., the top view shown in FIG. 15), the openings 411 may be disposed corresponding to the light-emitting element 20, the sensing element 31 and the radiating element 55. The light-shielding portion 412 of the black matrix 41 may cover a portion of the top surface of the substrate 10. For example, the light-shielding portion 412 does not overlap the light-emitting element 20, the sensing element 31 and the radiating element 55 in the normal direction N of the substrate 10. For example, the light-shielding portion 412 of the black matrix 41 may be disposed corresponding to the driving elements 37.

Since the opening 411 of the black matrix 41 may be disposed corresponding to the sensing element 31 (and the emitting element 55), when a user touches or approaches the surface of the tiled electronic apparatus 1 with a finger or another part of the body, the sensing element 31 may sense a change in light intensity entering the tiled electronic apparatus 1, thereby allowing the sensing element 31 to sense the position of the user's finger or another part of the body that is touching or approaching the tiled electronic apparatus 1, and in some embodiments, further executing a specific action in response. Moreover, when an emitter (e.g., IR pen, LASER pen, and so on) emits light, which has a wavelength that can be received by the sensing element 31, to the tiled electronic apparatus 1, the sensing element 31 may sense the light emitted by the emitter and entering the tiled electronic apparatus 1, thereby determining the position of the light emitted by the emitter pointing to the tiled electronic apparatus 1, and in some embodiments, further executing a specific action in response to serve an interactive function. Thus, the tiled electronic apparatus 1 may be used to display information or to serve an interactive function.

In some embodiments, the electronic device 150 may further include a cover layer (not shown in FIG. 15, which may refer to the cover layer 51 shown in FIG. 3, FIG. 4 or FIG. 8), and the cover layer may be disposed on the light-emitting element 20. In some embodiments, the sensing element 31 may also be disposed on the cover layer, but the present disclosure is not limited thereto.

Figure 16:
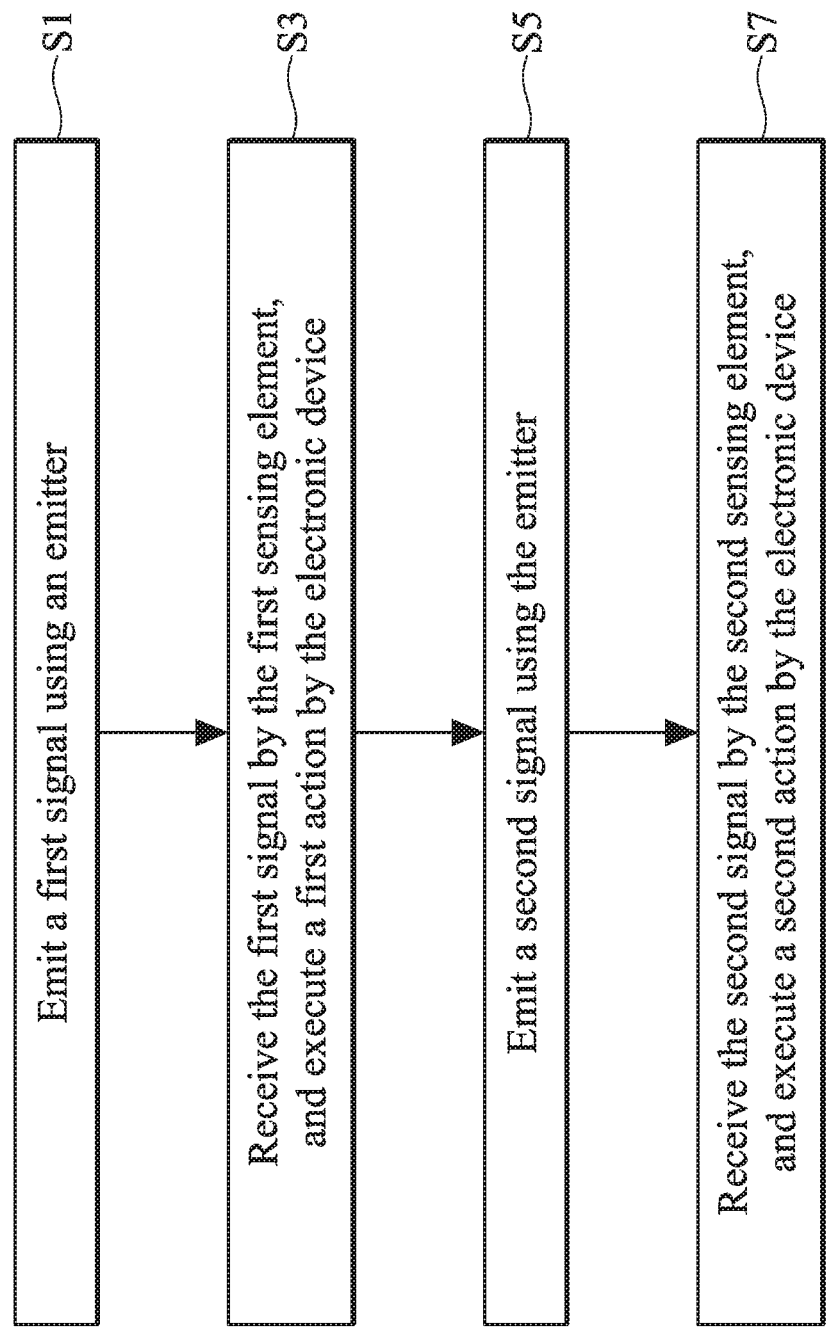
FIG. 16 is a block diagram of an operating method of an electronic device.

FIG. 16 is a block diagram of an operating method of an electronic device. It should be noted that some steps in FIG. 16 may be omitted, for the sake of brevity. In this embodiment, the electronic device may include, for example, the electronic device 100 shown in FIG. 1, the electronic device 102 shown in FIG. 2, the electronic device 104 shown in FIG. 3, the electronic device 106 shown in FIG. 4, the electronic device 108 shown in FIG. 6, the electronic device 110 shown in FIG. 7, the electronic device 112 shown in FIG. 8, the electronic device 114 shown in FIG. 9, the electronic device 116 shown in FIG. 13, the electronic device 118 shown in FIG. 14 or the tiled electronic apparatus 1 shown in FIG. 15.

In addition, in this embodiment, the electronic device may include a first sensing element and a second sensing element, and the first sensing element and the second sensing element may include, for example, the sensing element 31 or the sensing element 31', but the present disclosure is not limited thereto. In some embodiments, the first sensing element and the second sensing element may be the same, or the first sensing element and the second sensing element may be different. Hereinafter, the first sensing element and the second sensing element are described as the sensing element 31 or the sensing element 31' for an example. That is, the first sensing element and the second sensing element include thin-film transistors (TFTs), but the present disclosure is not limited thereto.

In step S1, an emitter emits a first signal. The emitter is, for example, an IR pen or LASER pen, and the first signal may be the light emitted by the emitter (e.g., infrared or LASER light), but the present disclosure is not limited thereto.

In step S3, the first sensing element receives the first signal, and the electronic device executes a first action (e.g., responding to the first signal). In some embodiments, the first action is to enable the electronic device to display a first display screen, and the first display screen may display the pointing position of the first signal, that is, the position of the light emitted by the emitter on the electronic device, but the present disclosure is not limited thereto.

In step S5, the emitter emits a second signal. In some embodiments, the second signal is different from the first signal. For example, the first signal and the second signal may have different frequencies, the first signal and the second signal may have different light source intensities, or the first signal and the second signal have different wavelengths, but the present disclosure is not limited thereto.

In step S7, the second sensing element receives the second signal, and the electronic device executes a second action (e.g., responding to the second signal). In this embodiment, the second action is different from the first action. For example, the second action is to enable the electronic device to display a second display screen, and the second display screen is different from the first display screen. In some embodiments, the second display screen may include an instruction menu, but the present disclosure is not limited thereto.

It should be noted that the first sensing element and the second sensing element described herein may be the same sensing element at the same position, or may be two sensing elements at different positions.

Through the foregoing steps S1 to S7, the user may simply implement the function of the mouse on the electronic device through the emitter. That is, the electronic device or the tiled electronic apparatus having the sensing function according to the embodiments of the present disclosure may be used to display information or to serve an interactive function.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. An electronic device, comprising:
   a substrate;
   a light-emitting element disposed on the substrate;
   a sensing element disposed on the substrate and adjacent to the light-emitting element;
   a black matrix disposed on the substrate and between the sensing element and the light-emitting element and having a plurality of openings and a light-shielding portion; and
   a driving element disposed adjacent to and electrically connected to the light-emitting element;
   wherein the sensing element comprises a first thin-film transistor, the driving element comprises a second thin-film transistor, and in a normal direction of the substrate, one of the plurality of openings is disposed corresponding to the sensing element, and the light-shielding portion is disposed corresponding to the driving element, and the sensing element and the light-emitting element are arranged along a direction perpendicular to the normal direction of the substrate.

2. The electronic device according to claim 1, wherein the first thin-film transistor comprises a first semiconductor layer, the second thin-film transistor comprises a second semiconductor layer, and a material of the first semiconductor layer is different from a material of the second semiconductor layer.

3. The electronic device according to claim 2, wherein the material of the first semiconductor layer or the material of the second semiconductor layer comprises low temperature poly-silicon, indium gallium zinc oxide or amorphous silicon.

4. The electronic device according to claim 1, further comprising:
   an active driving circuit comprising the driving element.

5. The electronic device according to claim 1, further comprising:
   an adhesion layer disposed on the light-emitting element and the sensing element.

6. The electronic device according to claim 1, wherein the light-emitting element comprises at least one light-emitting chip, and the at least one light-emitting chip is formed in a package structure.

7. A tiled electronic apparatus, comprising:
   a plurality of electronic devices, wherein one of the plurality of electronic devices has a display region and comprises:
   a substrate;
   a plurality of light-emitting elements disposed on the substrate and disposed in the display region;
   a plurality of sensing elements disposed in the display region and disposed adjacent to the plurality of light-emitting elements; and
   a black matrix disposed between the plurality of sensing elements and the plurality of light-emitting elements,
   wherein the plurality of sensing elements and the plurality of light-emitting elements are arranged along a direction perpendicular to a normal direction of the substrate.

8. The tiled electronic apparatus according to claim 7, wherein at least one of the plurality of sensing elements comprises a first thin-film transistor.

9. The tiled electronic apparatus according to claim 7, wherein one of the plurality of electronic devices further comprises:
   a plurality of driving elements disposed adjacent to the plurality of light-emitting elements, wherein at least one of the plurality of driving elements comprises a second thin-film transistor, and the second thin-film transistor is electrically connected to one of the plurality of light-emitting elements.

10. The tiled electronic apparatus according to claim 9, wherein
the black matrix comprises a plurality of openings and a light-shielding portion;
wherein in a normal direction of the substrate, the plurality of openings is disposed corresponding to the plurality of light-emitting elements, and the light-shielding portion is disposed corresponding to the plurality of driving elements.

11. An operating method of an electronic device as claimed in claim 7, wherein the plurality of sensing elements comprises a first sensing element and a second sensing element, and the operating method of the electronic device comprises:
emitting a first signal using an emitter;
receiving the first signal by the first sensing element, and executing a first action by the electronic device;
emitting a second signal using the emitter;
receiving the second signal by the second sensing element, and executing a second action by the electronic device;
wherein the first signal is different from the second signal, and the first action is different from the second action.

12. The operating method of the electronic device according to claim 11, wherein the first action is that the electronic device displays a first display screen, and the second action is that the electronic device displays a second display screen different from the first display screen.

13. The operating method of the electronic device according to claim 11, wherein the first signal and the second signal have different light source intensities, wavelengths or frequencies.

14. The operating method of the electronic device according to claim 11, wherein the first sensing element and the second sensing element are the same.

* * * * *